United States Patent
Kang et al.

(10) Patent No.: US 7,142,819 B1
(45) Date of Patent: Nov. 28, 2006

(54) CIRCUITS AND METHODS FOR CONTROLLING SWITCHING NOISE IN SWITCHED-MODE CIRCUITS

(75) Inventors: Chang Yong Kang, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/233,961

(22) Filed: Sep. 23, 2005

Related U.S. Application Data

(63) Continuation-in-part of application No. 10/715,950, filed on Nov. 18, 2003, now Pat. No. 7,010,271, which is a continuation of application No. 09/651,821, filed on Aug. 30, 2000, now abandoned.

(51) Int. Cl.
*H04B 1/00* (2006.01)

(52) U.S. Cl. .................. 455/63.3; 455/63.1; 455/71; 455/296; 455/114.1; 455/501; 332/107; 330/10; 330/256; 375/132; 375/238; 341/143; 341/152

(58) Field of Classification Search .................. 455/71, 455/296, 501, 63.1, 67.13, 114.1, 114.2, 63.3; 332/107; 300/10, 256; 375/132, 238; 341/143, 341/152
See application file for complete search history.

(56) References Cited

U.S. PATENT DOCUMENTS

| 4,653,069 | A | * | 3/1987 | Roeder | 380/31 |
| 6,023,199 | A | * | 2/2000 | Cheung | 332/109 |
| 6,545,533 | B1 | * | 4/2003 | Karki et al. | 330/10 |
| 6,587,670 | B1 | * | 7/2003 | Hoyt et al. | 455/71 |
| 6,593,807 | B1 | * | 7/2003 | Groves et al. | 330/10 |
| 6,674,789 | B1 | * | 1/2004 | Fardoun et al. | 375/132 |
| 6,819,912 | B1 | * | 11/2004 | Roeckner et al. | 455/296 |
| 6,970,503 | B1 | * | 11/2005 | Kalb | 375/238 |

\* cited by examiner

*Primary Examiner*—Steve M. D'Agosta
(74) *Attorney, Agent, or Firm*—James J. Murphy; Thompson & Knight LLP

(57) ABSTRACT

A method of controlling noise in a pulse width modulation circuit includes varying a sample frequency and a range of information levels, wherein each sample within a data sample stream at the sample frequency represents a level within the range of information levels, to shift in frequency noise generated at the sample frequency during encoding of the data sample stream into pulse width modulated patterns.

11 Claims, 3 Drawing Sheets

CIRCUITS AND METHODS FOR CONTROLLING SWITCHING NOISE IN SWITCHED-MODE CIRCUITS

CROSS REFERENCE TO RELATED APPLICATIONS

This application is a Continuation-In-Part application of pending application U.S. Ser. No. 10/715,950 entitled "Circuits and Methods for Reducing Interference from Switched Mode Circuits" filed on Nov. 18, 2003, now U.S. Pat. No. 7,010,271, which is a continuation of U.S. Ser. No. 09/651,821 entitled "Circuits and Methods for Reducing Interference from Switched Mode Circuits" filed on Aug. 30, 2000 which is abandoned.

FIELD OF INVENTION

The present invention relates in general to switched—mode circuit techniques, and in particular, to circuits and methods for controlling switching noise in switched—mode circuits.

BACKGROUND OF INVENTION

Class D audio power amplifiers (APAs) have been used for many years in systems, such as wireline telephony, where high bandwidth is not critical. More recently however, new fabrication techniques, and in particular, new techniques for fabricating power transistors, have made integrated Class D APAs possible. This result has extended their potential applications to lower-power, higher-bandwidth systems, including battery-powered portable music players and wireless communications devices.

One major advantage of Class D amplifiers is their efficiency. Generally, an input signal is converted into a relatively high frequency stream of pulses varying in width with the amplitude of the input signal. This pulse width modulated (PWM) signal switches a set of power output transistors driving an output load between cutoff and saturation, which results in efficiencies above ninety percent (90%). In contrast, the typical Class AB push-pull amplifier, using output transistors in which their conduction varies linearly during each half-cycle, has an efficiency of only around sixty percent (60%). The increased efficiency of Class D amplifiers in turn reduces power consumption and consequently lowers heat dissipation and improves battery life.

Similarly, switched mode power supplies have found wide acceptance in the design of compact electronic appliances. Switched mode power supplies advantageously use smaller transformers and are therefore typically more compact and of lighter weight. These features are in addition to the increased efficiency realized over linear power supplies. Moreover, the total number of components can be reduced to, for example, a power MOSFET die and a PWM controller die packaged together in a single package.

One of the disadvantages of using conventional switched mode devices is the interference (radiated and conducted) generated by the switching mechanism. This problem is of particular concern in compact electronic appliances which include a radio and similar audio circuits. For example, if the switching frequency of the given switched—mode device is nominally at 350 kHz, harmonics will be generated at 700 kHz, 1050 kHz and 1400 kHz, all of which fall within the AM radio broadcast band.

Given the importance of improved battery-life, reduced heat dissipation, and component size minimization in the design and construction of portable electronic appliances, improved switched mode techniques will have numerous practical advantages. The possible applications for these techniques are numerous, although Class D APAs and switched mode power supplies are two primary areas which should be considered.

SUMMARY OF INVENTION

The principles of the present invention are embodied in circuits and methods for controlling interference in systems, such as radio receivers, utilizing switched-mode circuitry. According to one particular embodiment of these principles, a method is disclosed for controlling noise in a pulse width modulation circuit, which includes varying a sample frequency and a range of information levels, wherein each sample within a data sample stream at the sample frequency represents a level within the range of information levels, to shift in frequency noise generated at the sample frequency during encoding of the data sample stream into pulse width modulated patterns.

The inventive concepts address one of the major disadvantages of conventional switched mode devices, namely, interference (noise) caused by the switching mechanism itself. This interference is of particular concern in systems employing radio receivers and similar interference sensitive circuitry. In accordance with the inventive principles, the switching frequency is shifted as a function of the radio frequency being received such that the switching frequency and its harmonics fall outside the frequency band of the received signal. Advantageously, these principles can be applied to different types of switched circuitry, including Class D amplifiers and power supplies.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
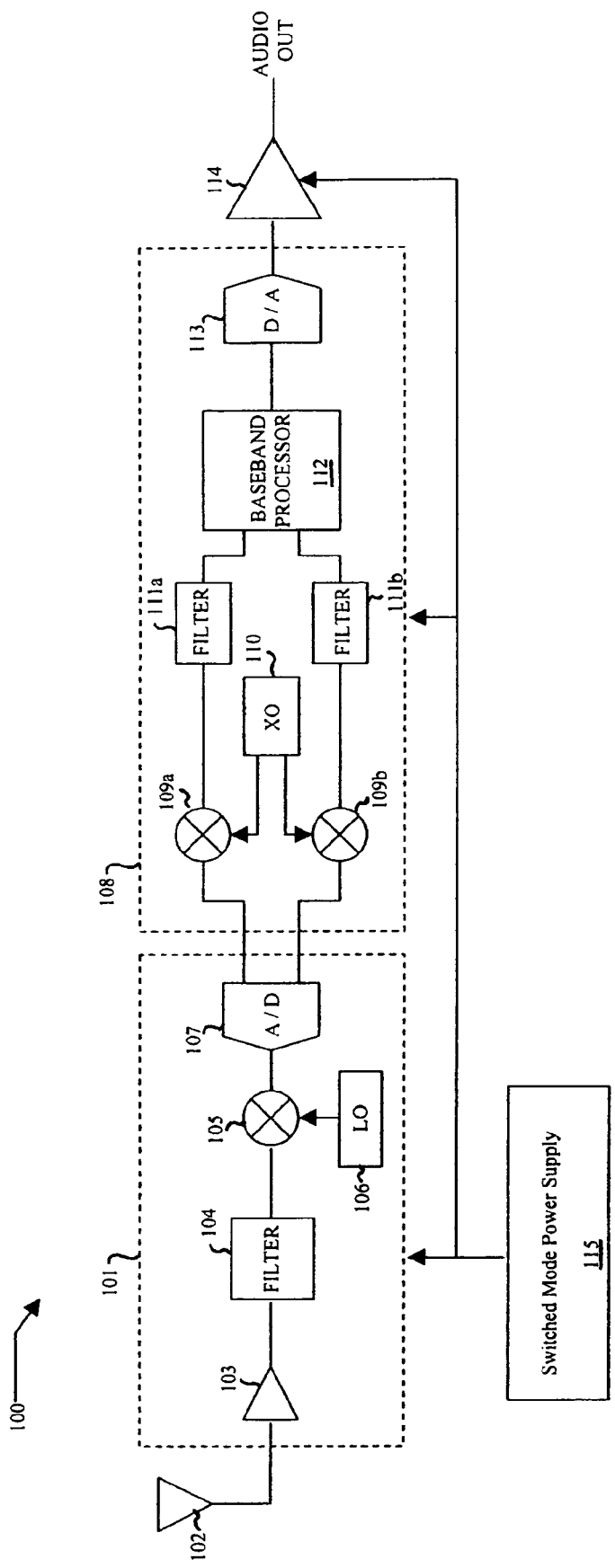
FIG. 1 is a high-level block diagram of a representative radio receiver suitable for describing one particular application of the principles of the present invention.

The principles of the present invention and their advantages are best understood by referring to the illustrated embodiment depicted in FIGS. 1–2 of the drawings, in which like numbers designate like parts.

FIG. 1 is block diagram of one channel of a digital radio 100 embodying the principles of the present invention. Digital radio 100 includes an analog section or front-end 101 which receives radio frequency (RF) signals from an associated antenna 102. Analog front-end 101 is preferably a conventional RF down-converter including a low noise amplifier (LNA) 103 for setting the system noise figure, a bandpass filter 104, and a mixer 105 driven by an analog local oscillator 106. The mixed-down analog signal is then converted into digital form by an analog to digital converter 107.

The digitized data output from A/D converter 107 is passed to digital processing section 108. Mixers 109a and 109b generate in-phase (I) and quadrature (Q) signals from a corresponding pair of clock phases from crystal oscillator 110. The I and Q signals are next passed through bandpass filters 111a and 111b and on to digital baseband processor 112. The processed digital signal is then re-converted to analog (audio) form by D/A converter 113.

According to the principles of the present invention, a switched-mode (Class D) audio power amplifier (APA) 114, discussed in detail below, is used to drive an external set of speakers or a headset (not shown). Preferably, at least some of the components of digital radio 100 are powered by a switched-mode power supply (SMPS) 114.

As discussed above, Class-D amplifiers generally utilize pulse-width (duty cycle) modulation (PWM) techniques, which realize a high efficiency amplifier operation by directly pumping electric current into an inductor—capacitor (L-C) filter through low-resistance power transistors. These low-resistance transistors are typically driven by a delta-sigma modulator, which quantizes and noise shapes the input signal, and a pulse width modulation (PWM) stage, which encodes the quantized samples output from the delta-sigma modulator into a stream of PWM encoded patterns. The output from the PWM stage drives the gates of the power transistors, which may be in either a half-bridge or full bridge configuration. The fundamental switching frequency of the power transistors approximates the output sample frequency of the delta-sigma modulator quantizer, $F_{SO}$.

A convenient system design, often utilized in audio systems, is based on the relationship:

$$F_{MCLK} = F_{SO} \cdot (N_{Level} - 1)$$

in which $F_{MCLK}$ is the master clock signal (oversampling) frequency of the system, $N_{Level}$ is the number of the quantizer levels at the delta-sigma modulator quantizer output, and $F_{SO} \cdot (N_{Level} - 1)$ is the data or "chip" rate of the PWM encoded patterns output from the PWM encoder.

In digital radio systems including a Class D amplifier operating at a typical output sample frequency $F_{SO}$ of several hundreds of KHz, the resulting switching related interference can make it very difficult to tune to radio stations operating at a frequency at, or close to, the $F_{SO}$ frequency. One possible solution to addressing this problem is to shift the master clock frequency $F_{MCLK}$, and hence the output sample frequency $F_{SO}$, when tuning to a radio station broadcasting at the same or a close frequency. However, this technique is costly to implement as it generally requires utilization of a phase-locked loop (PLL) circuit in the system.

According to the principles of the present invention, the master clock signal frequency $F_{MCLK}$ remains fixed, while the sample output frequency $F_{SO}$ is varied during radio frequency tuning to avoid the radio frequency band of interest. At the same time, the number of quantizer levels $N_{Level}$ is varied to preserve the information content in the PWM encoded signal. Generally, when the output sample frequency $F_{SO}$ is reduced, the number of quantizer levels $N_{Level}$ increases, and vice versa.

Figure 2A:
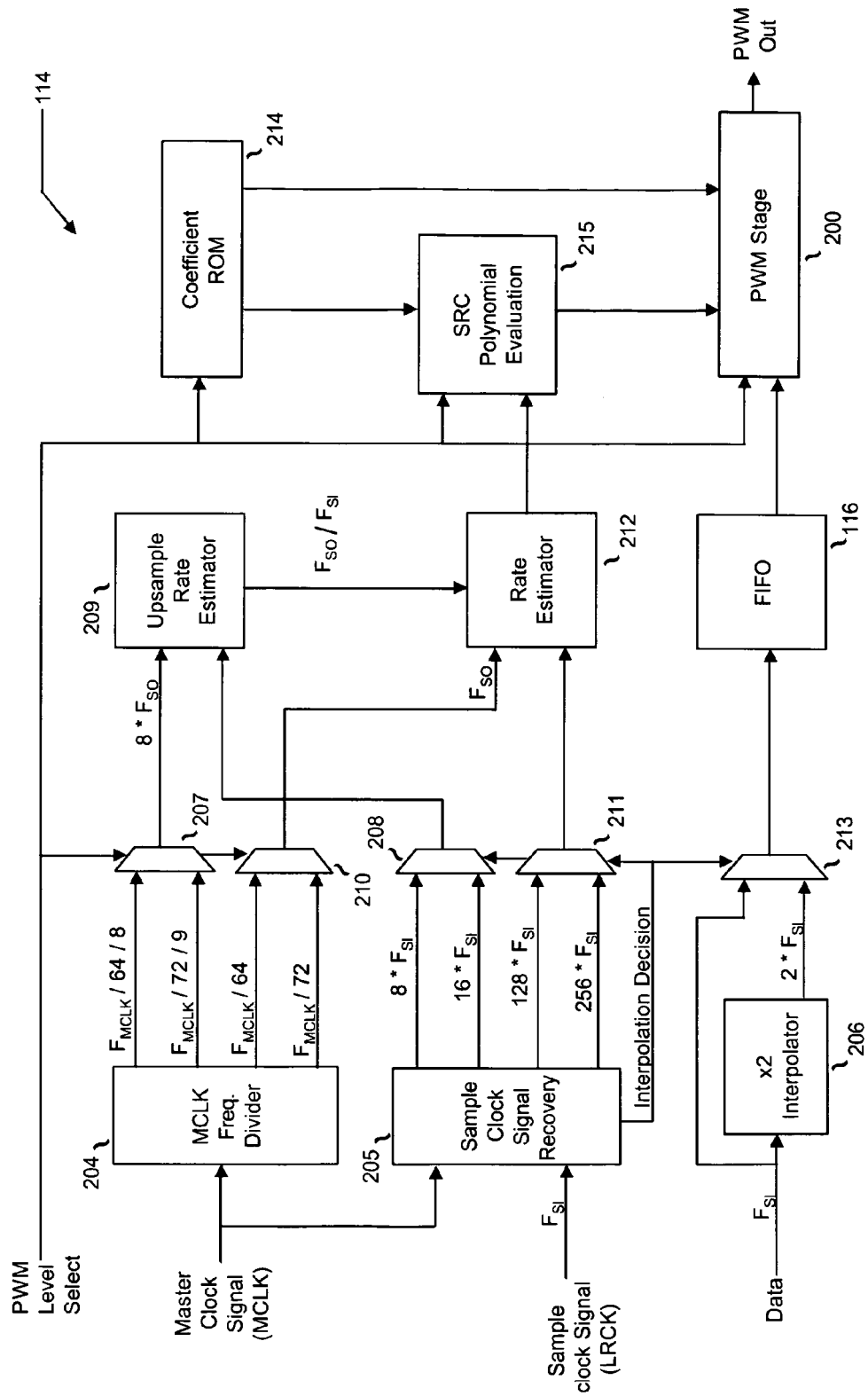
FIG. 2A is a block diagram of an exemplary audio power amplifier (APA) embodying the principles of the present invention and suitable for utilization in the radio receiver of FIG. 1.
Figure 2B:
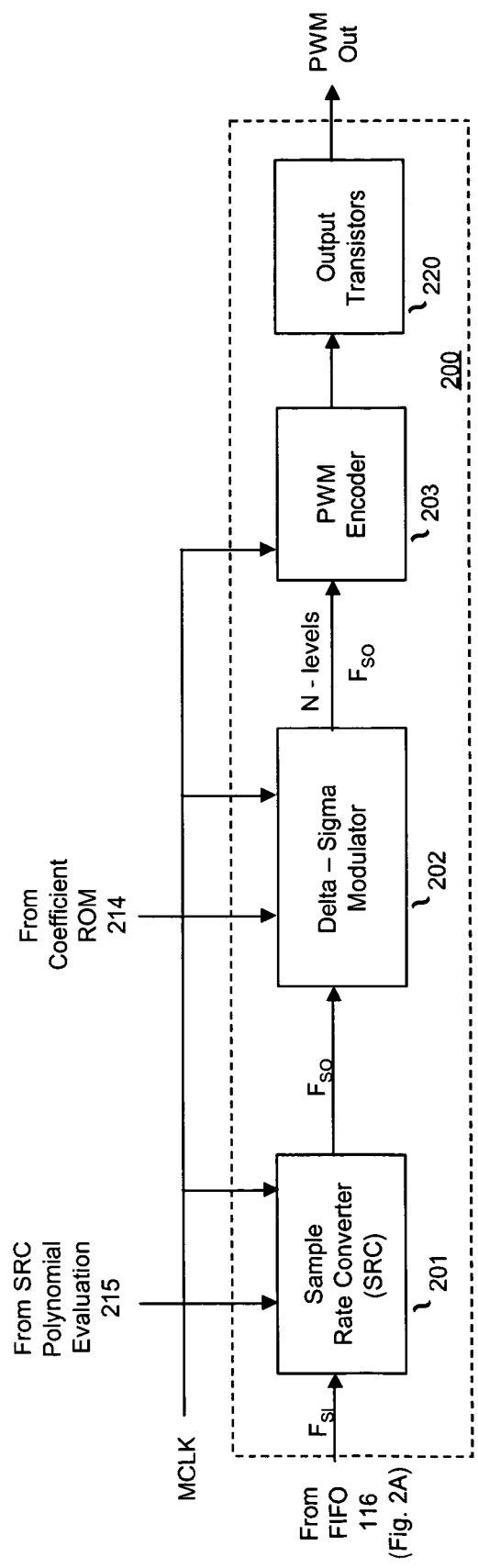
FIG. 2B is a more detailed block diagram of the pulse-width modulation (PWM) stage shown in FIG. 2A.

FIG. 2A is more detailed block diagram of APA 114 shown in FIG. 1. Generally, the embodiment of APA 114 shown in FIG. 2A is based on a pulse width modulation (PWM) stage 200, which is shown in further detail in FIG. 2B. PWM stage 200 includes a sample rate converter (SRC) 201, which converts a stream of digital samples from the input sample frequency $F_{SI}$ to the digital output sample frequency $F_{SO}$. The digital data stream output from SRC 201 is input into a delta-sigma modulator 202, which performs noise shaping and requantizes the data stream into requantized digital data samples, each representing N-number of information levels, at the output sample frequency $F_{SO}$. The requantized samples generated by delta-sigma modulator 202 are provided to a PWM encoder 203, which generates PWM encoded data patterns each representing one of the N-number of levels defined by the corresponding requantized data sample. PWM signal generation techniques are discussed in co-assigned U.S. Pat. No. 5,812,102 to Melanson, entitled "Delta Sigma PWM DAC to Reduce Switching," and incorporated herein by reference. The PWM encoded data drive a set of power output transistors 220, which may be in either a full-bridge or half-bridge configuration.

The number of levels $N_{Level}$ represented by each sample output from delta-sigma modulator 202 into PMW encoder 203 generally depends on the frequency at which radio 100 is tuned to, the input data frequency $F_{SI}$, and the output frequency $F_{SO}$ of the data stream output from SRC 201. Generally, the number of levels $N_{Level}$ varies as the output sample frequency $F_{SO}$ "hops" to avoid the frequency at which radio 100 is being tuned. For discussion purposes, a two-frequency hopping system based on the following characteristics will be assumed, although the number of possible frequency hops in the output sample frequency $F_{SO}$, as well as the chosen master clock frequency $F_{MCLK}$, the chosen output sample frequencies $F_{SO}$, and the number of quantizer levels, may vary depending on the specific system. The base mode for this exemplary embodiment is:

$F_{MCLK}$=24.576 MHz
$F_{SO}$=384 kHz
$N_{Level}$=65.

For the frequency-shift (frequency hopping) mode of operation:

$F_{MCLK}$=24.576 MHz
$F_{SO}$=341.333 kHz
$N_{Level}$=73.

It is a common practice to design a quantizer, such as the quantizer of delta-sigma modulator 202, to output quantized samples representing $2^n+1$ number of information levels because a $2^n+1$ level quantizer typically performs a simple truncation, which eliminates all but the first n+1 number of most significant bits (MSBs) of the sample. On the other hand, changing the quantization level to 73, for example, requires a 73-level quantizer, which cannot be implemented utilizing simple truncation. However, one economical way of implementing 73-level quantization, is to multiply each sample by 72 and then extract the first 7 MSB's by truncation. Advantageously, 72 can be numerically decomposed as 9×8 so that, in actual computation, a multiplication by 72 only amounts to a multiplication by 9 followed by a shift by 3 MSBs. Furthermore, because 9 is equal to 8+1 and a multiplication by 8 only requires a fixed shifter, a multiplication by 9 can also be realized by a simple adder and a shifter.

When a quantizer is used in the context of delta-sigma modulator, there always is a feedback path from the quantizer output to a summer at the modulator input. Consequently, if the data samples are multiplied by 9 before quantization, the quantizer output must be divided by 9 before feedback. In some delta-sigma modulator topologies, mostly "feedforward" architectures, an actual division (or, equivalently, a multiplication) must be performed in the feedback loop during frequency hopping. In other topologies, mostly "feedback" architectures, however, the division can be done implicitly by simply scaling the feedback coefficients during frequency hopping by 9 using a read-only memory (ROM) based table.

As shown in FIG. 2A, the system master clock (MCLK) signal is provided to an MCLK frequency divider 204. In the illustrated embodiment, PWM stage 200 operates at one of two output sample frequencies $F_{SO}$, namely $F_{MCLK}/64$ and $F_{MCLK}/72$. Consequently, two corresponding clock signals at the frequencies $F_{MCLK}/64$ and $F_{MCLK}/72$, along with a clock signal at the frequency $F_{MCLK}/64/8$ and a clock signal at the frequency $F_{MCLK}/72/9$, both of which corresponds to a frequency of eight (8) times the corresponding output sample frequency $F_{SO}$, are output by MCLK frequency divider 204.

Sample clock signal recovery circuitry 205 receives the sample clock signal (LRCK) at the input sampling frequency $F_{SI}$ and outputs internal clock signals at selected multiples of $F_{SI}$. In the illustrated embodiment, sample clock signal recovery circuitry 205 generates internal clock signals of eight times the input sampling frequency $F_{SI}(8*F_{SI})$, sixteen times the input sampling frequency $F_{SI}(16*F_{SI})$, one hundred and twenty eight times the input sampling frequency $F_{SI}(128*F_{SI})$, and two hundred and fifty six times the input sampling frequency $F_{SI}(256*F_{SI})$. Sample clock signal recovery circuitry also determines whether the input data stream will be interpolated by two in x2 interpolator 206 or input directly at the input sample frequency $F_{SI}$.

Shifting the number of PMW levels, as required to avoid interference in the radio frequency band is implemented by the PWM level select (PWML) signal generated in response to user tuning of radio 100 of FIG. 1. In response to the PWML signal, a selector 207 selects between the clock signal at the frequency $F_{MCLK}/64/8$ or the clock signal at the frequency $F_{MCLK}/72/9$, as generated by MCLK frequency divider 204. At the same time, in response to the interpolation decision performed by sample clock signal recovery circuitry 205, multiplexer 208 selects from either the clock signal at the frequency $8*F_{SI}$ or the clock signal $16*F_{SI}$ generated by sample clock signal recovery circuitry 205. The selected signal output by multiplexer 207, and the clock signal selected by multiplexer 208, are provided to upsample rate estimator 209, which generates an output representing the output sample frequency to input sample frequency ratio $F_{SO}/F_{SI}$.

The PWML signal also controls the selection by multiplexer 210 of either the clock signal at the frequency $F_{MCLK}/64$ or the clock signal at the frequency $F_{MCLK}/72$ generated by MCLK frequency divider 204. Concurrently, the interpolation decision signal generated by sample clock signal recover circuitry 205 selects between the clock signals at the frequencies $128*F_{SI}$ and $256*F_{SI}$, generated by sample clock signal recovery circuitry 205, through a multiplexer 211. The clock signal at the output frequency $F_{SO}$ selected by multiplexer 210 and the clock signal selected by multiplexer 211 provided to a rate estimator circuit 212.

In response to the frequency ratio $F_{SO}/F_{SI}$ generated by upsample rate estimator 209, the current output frequency $F_{SO}$ selected by multiplexer 210 in response to the PWML signal, and the oversampling rate selected by multiplexer 211, rate estimator 212 provides an estimate of the difference between the output sample frequency $F_{SO}$ and the input sample frequency $F_{SI}$. The estimation provided by rate estimator 212 is utilized by SRC polynomial evaluation circuitry 215, which controls the selection of the coefficients required by SRC 201 of FIG. 2B to convert the input sample frequency $F_{SI}$ of the data stream output from first and first out (FIFO) register 216 to the output sample frequency $F_{SO}$. The PWML signal additionally selects a set of coefficients from read only memory (ROM) 214, which are utilized by delta-sigma modulator 202 of FIG. 2B for noise shaping the sample stream at the selected output sample frequency $F_{SO}$.

In alternate embodiments of radio receiver 100, the source sample rate may be varied in ADCs 107 to implement frequency hopping. In these embodiments, SRC 201 of FIG. 2A may be eliminated.

The same inventive principles may be similarly implemented in switched-mode power supply 115 of FIG. 1 to ensure that any generated switching noise is shifted out of the radio frequency band of interest to avoid interference during signal reception by radio 100. In sum, according to the inventive principles, the switching frequency of a switched-mode (PWM) circuit is shifted such that the fundamental switching frequency and its harmonics fall outside the frequency band of interest, while the quantization level of the generating digital sample stream is proportionally varied to minimize the loss of information.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A method of controlling noise in a pulse width modulation circuit comprising:

selecting between first and second operating modes;

in response to an input signal received in the first operating mode:

generating at the sample frequency a data sample stream, wherein each sample within the data sample stream represents a level within a range of information level; and encoding the data sample stream into a stream of pulse width modulated data patterns at the sample frequency, wherein encoding the data sample stream generates noise at a frequency proportional to the sample frequency; and in response to an input signal received in the second operating mode:

generating at another sample frequency another data sample stream, wherein each sample within the another data stream represents a level within another range of information levels, and wherein the another sample frequency differs from the sample frequency and the another range of information levels differs from the range of information levels; and encoding the another data sample stream at the another sample frequency into a stream of pulse width modulated data patterns at the another sample frequency, wherein encoding the another data stream generates noise shifted to a frequency which is an integer multiple of the another sample frequency.

2. The method of claim 1, wherein a product of the sample frequency and the range of information levels approximates a product of the another sample frequency and a number of levels in the another range information levels.

3. The method of claim 2, wherein generating the data sample stream and encoding the data sample stream comprise generating and encoding the data sample stream with an clock signal of a fixed oversampling frequency such that a product of the sample frequency and a number of levels in the range of information levels and product of the another sample frequency and a number of levels in the another range of information levels are approximately equal to the fixed oversampling frequency.

4. The method of claim 1, wherein generating the data sample stream comprises generating a data sample stream with a delta-sigma modulator and selecting the selected number of information levels by selecting a corresponding range of modulator output quantization levels.

5. The method of claim 1, wherein generating the another sample stream with the another sample frequency comprises performing sample rate conversion on the data sample stream.

6. The method of claim 2, wherein generating the data sample stream at the sample frequency and having samples representing an information level within the range of information levels comprises selecting the sample frequency and the range of information levels to shift noise generated at the sample frequency from a corresponding frequency band in radio receiving system.

7. A method of controlling noise in a pulse width modulation system comprising:
receiving a radio frequency signal within a selected radio frequency band;
selecting a sample frequency and a number of information levels per sample for generating an audio data sample stream, wherein the sample frequency and the number of information levels per sample are selected to avoid generation of interference in the selected radio frequency band during subsequent encoding of the audio data sample stream into pulse width modulated patterns;
generating the audio data sample stream having the selected sample frequency and the selected number of information levels from the radio frequency signal;
encoding the data sample stream into the pulse width modulated data patterns at the sampling frequency;
receiving another radio frequency signal within another frequency band; and
in response to receiving another radio frequency signal, generating another data sample stream with another sample frequency and another number of information levels per sample, wherein the another sample frequency and the another number of information levels per sample differ from the sample frequency and the number of information levels per sample and are selected to avoid generation of interference in the another radio frequency band during subsequent encoding of the another sample stream into pulse width modulated patterns.

8. The method of claim 7, wherein generating another data sample stream with another sample frequency and another number of information levels per sample comprises selecting the another sample frequency and the another number of information levels per sample such that a product of the sample frequency and the number of information levels per sample approximates a product of the another sample frequency and the another number of information levels per sample.

9. The method of claim 7, wherein generating the another data sample stream with the another sample frequency comprises performing sample rate conversion on the data sample stream.

10. The method of claim 7, wherein generating the data stream and the another data stream comprise generating the data stream and the another data stream with a delta sigma modulator and selecting a number of quantization levels at the output of the delta sigma modulator to select between the number of information levels per samples and the another number of information levels per sample.

11. The method of claim 9, wherein generating and encoding are performed in response to a fixed-frequency clock signal such the product of the sample frequency and the number of information levels per sample and the product of the another sample frequency and the another number of information levels per sample equal the frequency of the fixed-frequency clock signal.

* * * * *